United States Patent [19]
Chen et al.

[11] Patent Number: 5,969,425
[45] Date of Patent: Oct. 19, 1999

[54] BORDERLESS VIAS WITH CVD BARRIER LAYER

[75] Inventors: Robert C. Chen, Los Altos, Calif.; David C. Greenlaw, Austin, Tex.; John A. Iacoponi, San Jose, Calif.

[73] Assignee: Advanced Micro Devices, Inc., Sunnyvale, Calif.

[21] Appl. No.: 08/924,131

[22] Filed: Sep. 5, 1997

[51] Int. Cl.⁶ ............................ H01L 23/48; H01L 23/52; H01L 29/40
[52] U.S. Cl. ......................... 257/774; 257/750; 257/751; 257/763; 257/764
[58] Field of Search .................................... 257/774, 750, 257/751, 760, 763, 764, 775

[56] References Cited

U.S. PATENT DOCUMENTS

| | | | |
|---|---|---|---|
| 5,202,579 | 4/1993 | Fujii et al. | 257/758 |
| 5,619,071 | 4/1997 | Myers et al. | 257/774 |
| 5,619,072 | 4/1997 | Metha | 257/774 |
| 5,808,364 | 9/1998 | Cronin et al. | 257/758 |

FOREIGN PATENT DOCUMENTS

| | | |
|---|---|---|
| 8-23028 | 1/1996 | Japan . |
| 2306777 | 5/1997 | United Kingdom . |

OTHER PUBLICATIONS

E.O. Travis et al., "A Scalable Submicron Contact Technology Using Conformal LPCVD TiN", International Electron Devices Meeting Technical Digest, Institute of Electrical and Electronics Engineers, Dec. 1990, pp. 47–50.

A.J. Konecni et al., "A Stable Plasma Treated CVD Titanium Nitride Film for Barrier/Glue Layer Applications," pp. 181–183, Jun. 18–20, 1996, VMIC Conference, 1996 ISMIC.

Kim et al., "Stability of TiN Films Prepared by Chemical Vapor Deposition Using Tetrakis–dimethylamino Titanium," J. Electrochem. Soc., vol. 143, No. 9, Sep. 1996, pp. L188–L190.

J. Iacoponi et al., "Resistivity Enhancement of CVD TiN with In–Situ Nitrogen Plasma and Its Application in Low Resistance Multilevel Interconnects," Advanced Metalization and Interconnection Systems for ULSI Applications in 1995.

Eizenberg et al., "Chemical vapor deposition TiCN: A new barrier metallization for submicron via and contact applications," J. Vac. Sci. Technol. A 13(3), May/Jun. 1995, pp. 590–595.

Eizenberg et al., "TiCN: A new chemical vapor deposited contact barrier metallization for submicron devices," Appl. Phys. Lett., vol. 65, No. 19, Nov. 7, 1994, pp. 2416–2418.

Hillman et al., "Comparison of Titanium Nitride Barrier Layers Produced by Inorganic and Organic CVD," pp. 246–252, Jun. 9–10, 1992, VMIC Conference, 1992 ISMIC.

C.C. Liu et al., "Integrated HDP Technology for Sub–0.25 Micron Gap Fill," pp. 618–619, Jun. 10–12, 1997, VMIC Conference, 1997 ISMIC.

S. Bothra, "Integration of 0.25 $\mu$m Three and Five Level Interconnect System For High Performance ASIC," pp. 43–48, Jun. 10–12, 1997, VMIC Conference, 1997 ISMIC.

Y. Wang et al., "Process Window Characterization of ULTIMA HDP–CVD™ USG Film," pp. 405–408 and 619, Feb. 10–11, 1997, DUMIC Conference, 1997 ISMIC.

T. Saikawa et al., "High Density Plasma CVD for 0.3$\mu$m Device Application," pp. 69–75, Jun. 18–20, 1996, VMIC Conference, 1996 ISMIC.

S. Nguyen et al., "Characterization of High Density Plasma Deposited Silicon Oxide Dielectric for 0.25 Micron ULSI," pp. 69–74, Jun. 27–29, 1995, VMIC Conference, 1995 ISMIC.

*Primary Examiner*—Mahshid Saadat
*Assistant Examiner*—Jhihan B. Clark

[57] ABSTRACT

Borderless vias are filled by initially depositing a thin, conformal layer of titanium nitride by chemical vapor deposition to cover an undercut, etched side surface of a lower metal feature. A metal, such as tungsten, is subsequently deposited to fill the borderless via. Embodiments include thermal decomposition of an organic-titanium compound, such as tetrakis-dimethylamino titanium, and treating the deposited titanium nitride in an $H_2/N_2$ plasma to lower its resistivity.

15 Claims, 3 Drawing Sheets

BORDERLESS VIAS WITH CVD BARRIER LAYER

TECHNICAL FIELD

The present invention relates to a method of manufacturing a high density, multi-metal layer semiconductor device exhibiting a reliable interconnection pattern. The invention has particular applicability in manufacturing high density multi-metal layer semiconductor devices with design features of 0.25 microns and under.

BACKGROUND ART

The escalating requirements for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer, such as spin-on-glass (SOG) or high density plasma (HDP) oxide, is then applied to the resulting conductive pattern to fill in the gaps and the surface is planarized, as by conventional etching or chemical-mechanical polishing (CMP) planarization techniques.

As feature sizes, e.g., metal lines and interwiring spacings, shrink to 0.25 microns and below, such as 0.18 microns, it becomes increasingly difficult to satisfactorily fill in the interwiring spacings voidlessly and obtain adequate step coverage. It also becomes increasingly difficult to form a reliable interconnection structure. A through-hole is typically formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature.

A conventional conductive via is illustrated in FIG. 1, wherein first metal feature 10 of a first patterned metal layer is formed on first dielectric layer 11 and exposed by through-hole 12 formed in second dielectric layer 13. First metal feature 10 comprises side surfaces which taper somewhat due to etching and is typically formed as a composite structure comprising a lower metal layer 10A, e.g., titanium (Ti) or tungsten (W), an intermediate or primary conductive layer 10B, e.g., aluminum (Al) or an Al alloy, and an anti-reflective coating (ARC) 10C, such as titanium nitride (TiN). In accordance with conventional practices, through-hole 12 is formed so that first metal feature 10 encloses the entire bottom opening, thereby serving as a landing pad for the metal plug filling through-hole 12 to form the conductive via. Thus, the entire bottom surface of conductive via 16 is in direct contact with first metal feature 10. Conductive via 16 electrically connects first metal feature 10 and second metal feature 14 which is part of a second patterned metal layer. Second metal feature 14 is also typically formed as a composite structure comprising lower metal layer 14A, primary conductive layer 14B and ARC 14C. The plug filling the through-hole to form the conductive via is typically formed as a composite comprising a first adhesion promoting layer 15, which is typically a refractory material, such as TiN, Ti—W, or Ti—TiN, and a primary plug filling metal 17 such as W. Metal features 10 and 14 typically comprise metal lines with interwiring spacings therebetween conventionally filled with dielectric material 18, such as SOG or HDP oxide.

The reduction in design features to the range of 0.25 microns and under requires extremely high densification which mandates high aspect ratio (height/diameter) openings. As the aspect ratio of openings increases, it becomes increasingly more difficult to deposit a barrier layer 15 (FIG. 1) as by conventional sputtering techniques. It has been recently suggested that chemical vapor deposited (CVD) TiN can be employed to form a conformal coating in a high aspect ratio through-hole, as by the decomposition of an inorganic compound containing Ti, such as tetrakis-dimethylamino titanium (TDMAT). It has also been found that CVD TiN films exhibit a high carbon content and high resistivity. Accordingly, it has also been proposed to treat a deposited CVD TiN film in a hydrogen ($H_2$)/nitrogen ($N_2$) plasma to remove carbon and reduce the resistivity of the CVD TiN film. See, for example, A. J. Konecni et al., "A STABLE PLASMA TREATED CVD TITANIUM NITRIDE FILM FOR BARRIER/GLUE LAYER APPLICATIONS," pp. 181–183, Jun. 18–20, 1996, VMIC Conference, 1996 ISMIC; Kim et al., "Stability of TiN Films Prepared by Chemical Vapor Deposition Using Tetrakis-dimethylamino Titanium," J. Electrochem. Soc., Vol. 143, No. 9, September 1996, pp. L188–L190; J. Iacoponi et al., "RESISTIVITY ENHANCEMENT OF CVD TiN WITH IN-SITU NITROGEN PLASMA AND ITS APPLICATION IN LOW RESISTANCE MULTILEVEL INTERCONNECTS," Advanced Metalization and Interconnection Systems for ULSI Applications in 1995; Eizenberg et al., "Chemical vapor deposition TiCN: A new barrier metallization for submicron via and contact applications," J. Vac. Sci. Technol. A 13(3), May/June 1995, pp. 590–595; Eizenberg et al., "TiCN: A new chemical vapor deposited contact barrier metallization for submicron devices," Appl. Phys. Lett., Vol. 65, No. 19, Nov. 7, 1994, pp. 2416–2418; and Hillman et al., "COMPARISON OF TITANIUM NITRIDE BARRIER LAYERS PRODUCED BY INORGANIC AND ORGANIC CVD," pp. 246–252, Jun. 9–10, 1992, VMIC Conference, 1992 ISMIC.

The conventional practice of forming a landing pad completely enclosing the bottom surface of a conductive via utilizes a significant amount of precious real estate on a semiconductor chip which is antithetic to escalating high densification requirements. In addition, it is extremely difficult to voidlessly fill through-holes having such reduced dimensions because of the extremely high aspect ratio, e.g., in excess of 4. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

The use of borderless vias, however, creates new problems. For example, as a result of misalignment, the SOG gap filling layer is penetrated by etching when forming a through-hole, due to the low density and poor stability of SOG. As a result of such penetration, moisture and gas accumulate thereby increasing the resistance of the interconnection. Moreover, spiking can occur, i.e., penetration of the metal plug to the substrate causing a short.

In copending application Ser. No. 08/924,133, filed on Sep. 5, 1997, a method is disclosed comprising gap filling with HDP oxide deposited by high density plasma chemical vapor deposition (HDP-CVD), wherein annealing is performed in order to increase the grain size and, consequentially, improve the electromigration resistance of the patterned metal layers.

However, the use of borderless vias is also problematic in that a side surface of a metal feature is exposed to etching during formation of the through-hole, resulting in the undesirable formation of an etched undercut portion of a side surface of the metal feature. Adverting to FIG. 2, first metal feature 20 is formed on first insulating layer 21. First metal feature 20 is part of a first patterned metal layer comprising a first lower metal layer 20A, a primary intermediate metal layer 20B, such as Al or an Al alloy, and an upper ARC 20C. A second dielectric layer 22 is formed on the first patterned metal layer and through-hole 23 etched therein, which through-hole is purposely misaligned, thereby exposing a portion 24 of the upper surface of first metal feature 20 and undercutting a portion of a side surface of metal feature 20 to form an etched undercut portion 25 in the form of a concavity extending under but not including ARC 20C. The difficulty of filling a borderless via having a high aspect ratio is exacerbated by the even higher aspect ratio of the portion of the borderless via adjacent the etched undercut portion 25 on the side surface of first metal feature 20. The difficulty in depositing a barrier material on undercut concave portion 25 becomes acutely problematic.

In depositing W from tungsten hexafluoride ($WF_6$) vapor, it is recognized that an interaction with Al occurs. Accordingly, as depicted in FIG. 1, conventional practices comprise depositing a barrier layer 15, such as TiN, by sputtering. However, it is extremely difficult to sputter TiN in a through-hole having a high aspect ratio, let alone to coat concave undercut portion on the side surface of a lower metal feature in the offset region. Accordingly, there exists a need for a methodology enabling the formation of a TiN barrier layer on an undercut side surface of a lower metal feature for electrical connection to an upper metal feature by a borderless via.

DISCLOSURE OF THE INVENTION

An object of the present invention is a high density multilevel semiconductor device with design features of 0.25 microns and under and a reliable interconnection structure comprising borderless vias.

Another object of the present invention is a method of manufacturing a high density multi-metal layer semiconductor device with design features of 0.25 microns and under and a reliable interconnection structure comprising borderless vias.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a first dielectric layer formed on a substrate; a first patterned metal layer having gaps formed on the first dielectric layer, wherein the first patterned metal layer comprises a first metal feature with an upper surface and side surfaces; a second dielectric layer formed on the first patterned metal layer; a through-hole having an internal surface formed in the second dielectric layer exposing a portion of the upper surface and a portion of a side surface of the first metal feature, wherein the exposed side surface has an undercut concave portion formed by etching the through-hole; a layer of chemical vapor deposited barrier material lining the internal surface of the through-hole, the exposed portion of the upper surface and undercut concave portion of the side surface of the first metal feature; and conductive material in the lined opening filling the through-hole and forming a borderless via.

Another aspect of the present invention is a method of manufacturing a semiconductor device, which method comprises: forming a first dielectric layer on a substrate; forming a first patterned metal layer having gaps on the first dielectric layer, wherein the first patterned metal layer comprises a first metal feature with an upper surface and side surfaces; forming a second dielectric layer on the first patterned metal layer; etching to: form a through-hole having an internal surface in the second dielectric layer; expose a portion of the upper surface of the first metal feature; and expose, and etch to form an undercut concave portion in, a side surface of the first metal feature; and depositing a layer of barrier material by chemical vapor deposition to line the: internal surface of the through-hole; exposed upper portion of the first metal feature; and concave portion of the first metal feature.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
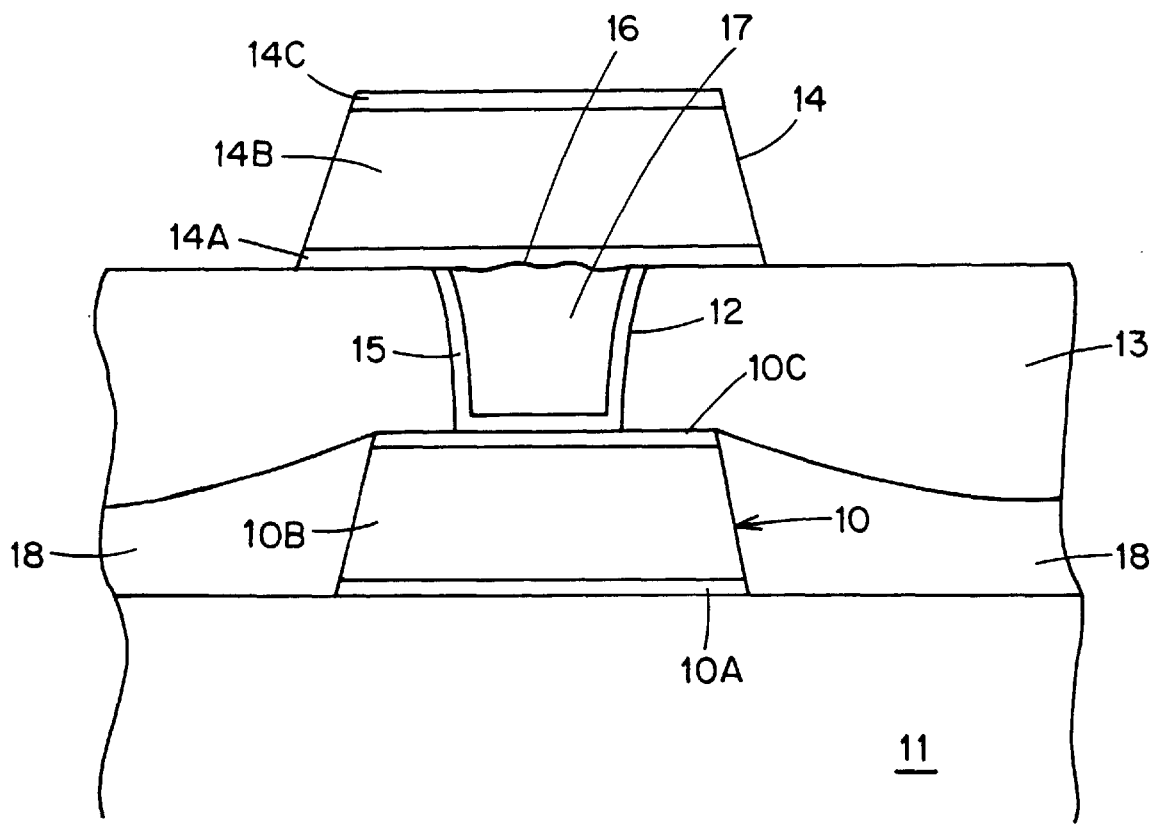
FIG. 1 schematically illustrates a conventional via structure.
Figure 2:
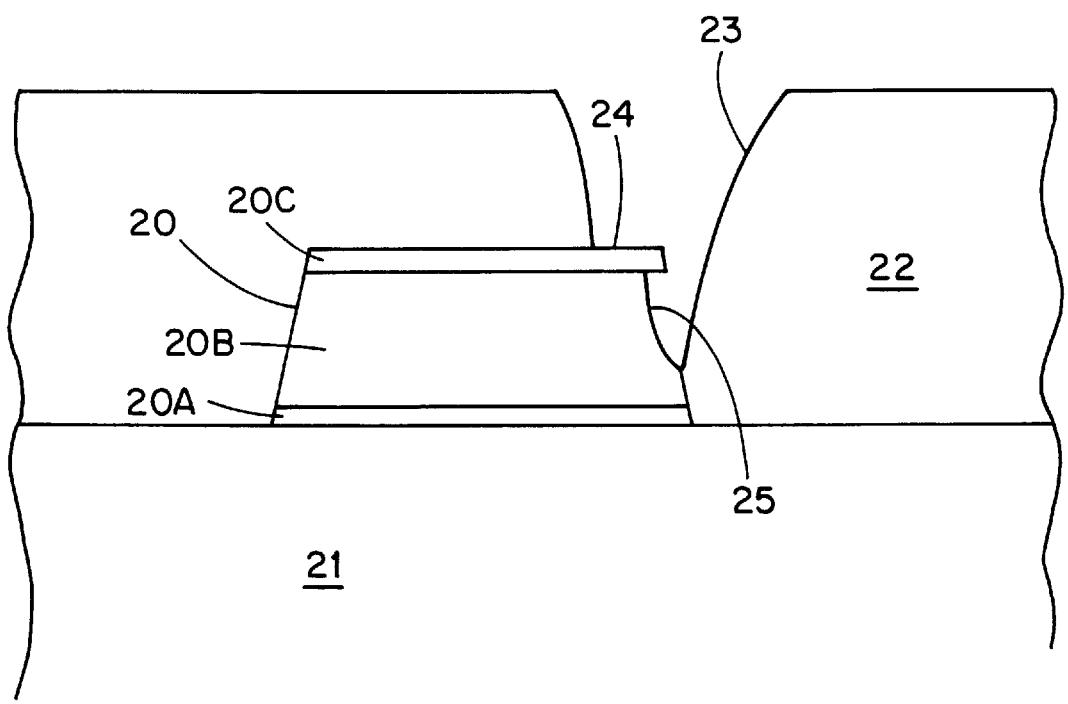
FIG. 2 schematically illustrates the conventional undercutting problem in forming a borderless via.

The present invention addresses and solves the undercutting problem, illustrated in FIG. 2, wherein a portion of a side surface of an underlying metal feature 20 is etched during formation of through-hole 23 resulting in concave portion 25. It is virtually impossible to sputter deposit a TiN barrier layer in high aspect ratio openings, particularly the extremely high aspect ratio of an offset through-hole formed along a side surface of an underlying metal feature when forming a borderless via. If undercut portion 25 is not provided with a conformal barrier film, reaction with $WF_6$ during plug filling would occur. Moreover, if a barrier film is not formed directly on the undercut portion 25, the resulting interconnection would contain a void and etching residues which would increase the resistance of the interconnection and adversely affect device performance.

The present invention stems from the unexpected discovery that the use of CVD TiN provides conformal coverage not only in relatively high aspect ratio openings, but also provides a conformal adherent coating on an undercut concave portion of a sidewall of a lower metal feature when forming a borderless via, such as undercut portion 25 depicted in FIG. 2. In accordance with the present invention, a first patterned metal layer is formed comprising a first metal feature, such as a metal line. The patterned metal layer can be formed by a conventional etch back technique, wherein a metal layer is deposited, a photomask formed thereon, and the metal layer etched to form a design pattern comprising submicron features below about 0.25 microns, e.g., below about 0.18 microns. Alternatively, a patterned metal layer can be formed by damascene techniques.

In accordance with the present invention, a second dielectric layer is formed on the first patterned metal layer, and a through-hole having an internal surface is formed in the second dielectric layer. The filled through-hole is intended to form a borderless via. Accordingly, the through-hole is intentionally misaligned to expose a portion of a side surface of the underlying metal feature. As the side surface of the metal feature does not contain an etch resistant material, such as an ARC, the side surface is etched when forming the through-hole, resulting in concave portion 25 (FIG. 2) extending under ARC 20C. A conformal TiN barrier layer is then formed by CVD on the internal surface of the through-hole, the exposed upper surface of the underlying first metal feature and, unexpectedly, on the undercut concave portion of the side surface of the underlying first metal feature. In an embodiment of the present invention, CVD is effected by thermal decomposition of an organic titanium compound, such as TDMAT.

The CVD TiN barrier layer, as deposited, typically contains an undesirably high concentration of carbon and, hence, exhibits an undesirably high resistivity. In an embodiment of the present invention, the CVD TiN barrier layer is treated with a plasma, such as an $H_2/N_2$ plasma, to reduce its carbon content and, consequently, reduce its resistivity. In depositing and plasma treating the CVD TiN barrier layer, one having ordinary skill in the art can easily optimize appropriate process parameters to achieve the objectives of the present invention. For example, the deposition and treatment techniques disclosed in the previously mentioned Konecni et al., Kim et al., and Iacoponi et al. publications can be employed, and the deposition technique disclosed by Eizenberg et al. can be employed. In conducting the $H_2/N_2$ plasma treatment in accordance with the present invention, it has been found suitable to employ a hydrogen flow of about 300 sccm and a nitrogen flow of about 200 sccm, at a temperature of about 450° C., pressure of about 1.3 Torr., RF power of about 750 W and time of about 25 to about 45 seconds, depending on the film thickness.

The CVD TiN barrier layer formed in accordance with the present invention has a microstructure comprising amorphous and crystalline regions, typically an amorphous matrix with crystalline regions embedded therein. The metal layers formed in accordance with the present invention are typically formed as a composite structure comprising a bottom metal layer, e.g., Ti or W, a primary conductive metal layer, such as Al or an Al alloy, e.g., an aluminum-copper alloy, and an upper anti-reflective layer, such as Ti—TiN. In patterning the metal layer by the conventional etch back technique, gap filling is conducted in a conventional manner, as by employing a spin-on-dielectric, such as SOG, or by depositing an HDP oxide, preferably an HDP oxide employing the HDP-CVD technique disclosed in copending application Ser. No. 08/924,133, filed on Sep. 5, 1997.

It was found that the CVD TiN barrier layers formed in accordance with the present invention, after plasma treating, exhibit a thickness of about 50 Å to about 250 Å, a carbon content less than about 4%–5% and a resistivity less than about 250 micro ohm-cm. After depositing a CVD TiN barrier layer, the through-hole is filled with a conductive material, such as W, employing conventional methodology, such as conventional CVD techniques, to form a composite plug in the borderless via. A second metal layer is then deposited on the second dielectric layer and patterned to form an upper second metal feature electrically connected to the underlying first metal feature through the borderless via formed in accordance with the present invention.

Figure 3:
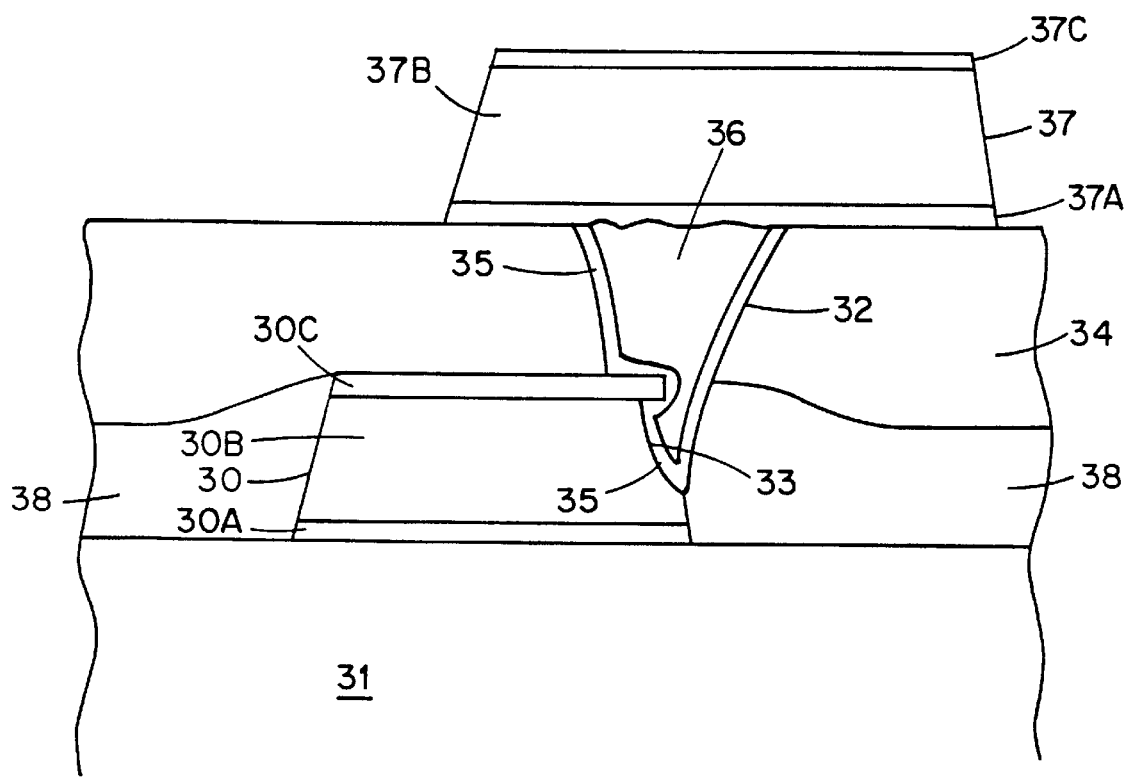
FIG. 3 schematically illustrates a borderless via formed in accordance with an embodiment of present invention.

An embodiment of the present invention is schematically illustrated in FIG. 3 and comprises first metal feature 30 formed on first dielectric layer 31 which in turn is formed on a substrate (not shown), such as an appropriately doped silicon semiconductor substrate. First metal feature 30, such as a conductive line, comprises first metal layer 30A, such as W or Ti, primary conductive metal layer 30B, such as Al or an Al alloy, and ARC 30C, such as Ti—TiN. Gaps, such as interwiring spacings on both sides of first metal feature 30, are filled by dielectric material 38, such as SOG or an HDP oxide. A second dielectric layer 34 is formed on first pattern metal layer and a misaligned through-hole 32 formed in second dielectric layer 34, whereby a portion of the underlying side surface of first metal feature 30 is etched to form undercut concavity 33 under the exposed ARC portion. In accordance with the present invention, a conformal TiN layer 35 is formed by CVD, as by thermal decomposition of an organic titanium compound, such as TDMAT. The CVD TiN barrier layer is then exposed to an $H_2/N_2$ plasma treatment to reduce its carbon content and resistivity. The through-hole 32 is then filled with a suitable metal 36, such as W. A second metal layer is then deposited on second dielectric layer 34 and patterned to form a second metal feature 37 comprising first metal layer 37A, e.g., Ti or W, primary intermediate metal layer 37B, e.g., Al or an Al alloy, and an upper ARC 37C, such as Ti—TiN, which second metal feature 37 is electrically connected to first metal feature 30 by a borderless via comprising conformal CVD TiN layer 35 and W plug 36. The unexpected formation of CVD TiN barrier layer on undercut concave portion 35 underlying exposed ARC 30C enables voidlessly filling misaligned through-hole 32 without any undesirable reaction with primary metal layer 30B.

The present invention is applicable to the production of various types of semiconductor devices, particularly high density, multi-metal layer semiconductor devices, with submicron features of 0.25 microns and below, exhibiting high speed characteristics and improved interconnection reliability. The present invention is cost effective and can easily be integrated into conventional processing.

In carrying out the embodiments of the present invention, the metal layers, particularly the intermediate layer, can be formed of any metal typically employed in manufacturing semiconductor devices, such as Al, Al alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and plasma enhanced chemical vapor deposition (PECVD). Normally, when high melting metal point metals such as tungsten are deposited, CVD techniques are employed. Low melting point metals, such as Al and Al alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:
    a first dielectric layer formed on a substrate;
    a first patterned metal layer having gaps formed on the first dielectric layer, wherein the first patterned metal layer comprises a first metal feature with an upper surface and side surfaces;
    a second dielectric layer formed on the first patterned metal layer;
    a through-hole having an internal surface formed in the second dielectric layer exposing a portion of the upper surface and a portion of a side surface of the first metal feature, wherein the exposed side surface has an undercut concave portion formed by etching the through-hole;
    a layer of chemical vapor deposited barrier material lining the internal surface of the through-hole, the exposed portion of the upper surface and undercut concave portion of the side surface of the first metal feature; and
    conductive material in the lined opening filling the through-hole and forming a borderless via.

2. The semiconductor device according to claim 1, wherein the chemical vapor deposited barrier material comprises titanium nitride.

3. The semiconductor device according to claim 2, wherein the chemical vapor deposited titanium nitride has a microstructure comprising amorphous and crystalline regions.

4. The semiconductor device according to claim 2, wherein the conductive material in the opening comprises tungsten.

5. The semiconductor device according to claim 2, wherein the gaps are filled with a dielectric material.

6. The semiconductor device according to claim 2, wherein the titanium nitride barrier layer is deposited by decomposing an organic compound comprising titanium.

7. The semiconductor device according to claim 2, wherein the metal feature is a metal line and the gaps comprise interwiring spacings.

8. The semiconductor device according to claim 3, wherein the microstructure is characterized by an amorphous matrix containing crystalline regions.

9. The semiconductor device according to claim 3, wherein the patterned metal layer has a composite structure comprising:
    a bottom metal layer;
    an intermediate metal layer containing aluminum or an aluminum alloy; and
    an upper anti-reflective coating.

10. The semiconductor device according to claim 3, further comprising a second patterned metal layer on the second dielectric layer, wherein the second patterned metal layer comprises a second metal feature electrically connected to the first metal feature through the borderless via.

11. The semiconductor device according to claim 9, wherein the bottom metal layer comprises titanium or tungsten; and the anti-reflective coating comprises titanium-titanium nitride.

12. The semiconductor device according to claim 9, wherein the undercut concave portion extends under, without including, the anti-reflective coating.

13. The semiconductor device according to claim 6, wherein the organic compound is tetrakis-dimethylamino titanium.

14. The semiconductor device according to claim 13; wherein the titanium nitride barrier layer has a carbon content less than about 4% to 5% by weight and a resistivity less than about 250 micro ohm-cm.

15. The semiconductor device according to claim 14, wherein the titanium nitride barrier layer has a thickness of about 50 Å to about 250 Å.

* * * * *